United States Patent [19]

Musa

[11] 4,048,575

[45] * Sept. 13, 1977

[54] OPERATIONAL AMPLIFIER

[75] Inventor: Fuad H. Musa, Tempe, Ariz.

[73] Assignee: Motorola, Inc., Schaumburg, Ill.

[*] Notice: The portion of the term of this patent subsequent to May 11, 1993, has been disclaimed.

[21] Appl. No.: 505,196

[22] Filed: Sept. 11, 1974

[51] Int. Cl.² .......................... H03F 3/16; H03F 3/45
[52] U.S. Cl. .................................. 330/22; 330/30 D; 330/35
[58] Field of Search ................... 330/22, 30 D, 35, 40; 307/304

[56] References Cited

U.S. PATENT DOCUMENTS

| | | | |
|---|---|---|---|
| 3,395,358 | 7/1968 | Petersen | 330/30 D |
| 3,696,305 | 10/1972 | Mitchell et al. | 330/35 X |
| 3,715,693 | 2/1973 | Fletcher et al. | 330/35 X |
| 3,760,288 | 9/1973 | Leonard | 330/30 D |
| 3,810,031 | 5/1974 | Poujois | 330/35 X |
| 3,870,966 | 3/1975 | Dingwall | 330/35 X |
| 3,947,778 | 3/1976 | Hsiao et al. | 330/35 X |
| 3,956,708 | 5/1976 | Musa | 330/35 X |

FOREIGN PATENT DOCUMENTS 1,239,213 7/1971 United Kingdom .............. 330/30 D

OTHER PUBLICATIONS

Sherwin et al., "Fets as Constant Current Sources," EEE, Oct. 1967, pp. 82-85.
Jacobson, "Sense Amplifier," *IBM Technical Disclosure Bulletin* vol. 15, No. 6, Nov. 1972, pp. 1732-1733.

*Primary Examiner*—James B. Mullins
*Attorney, Agent, or Firm*—Robert A. Farley

[57] ABSTRACT

A family of operational amplifiers are described which utilize only MOSFET transistors as the active devices. These operational amplifiers exhibit an infinite input impedance and zero input offset and bias currents. The circuits are capable of operating over a wide range of DC supply voltages at extremely low DC current drain. An operational amplifier is shown which operates from a single positive DC supply voltage and which handles a wide range of input common mode voltage swings including some negative common mode voltages. Another operational amplifier is shown which operates from a combination of a single positive and a single negative supply voltage and which handles a wide range of positive and negative input common mode voltage swings.

4 Claims, 11 Drawing Figures

FIG. 2
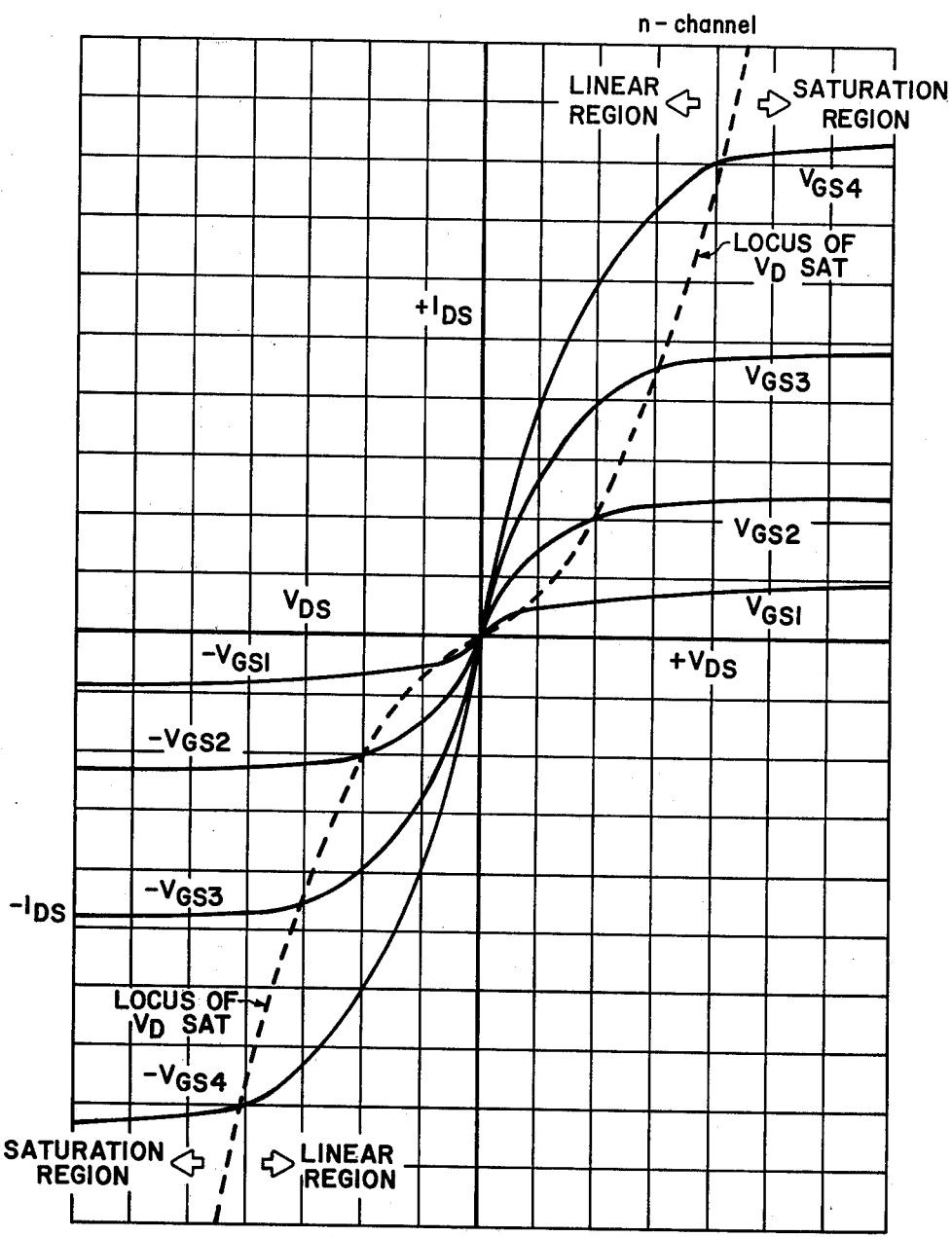
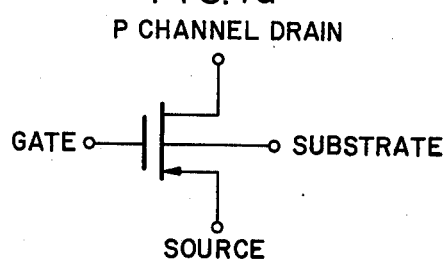
FIG. 1a
P CHANNEL
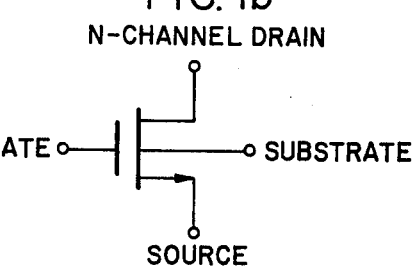
FIG. 1b
N-CHANNEL

OPERATIONAL AMPLIFIER

BACKGROUND OF THE INVENTION

Operational amplifiers typically utilize bipolar transistors for active devices. It is characteristic of such amplifiers to have relatively low input impedance and high input offset and bias currents. In order to overcome these problems, some amplifiers utilize either junction-field effect transistors of MOS field effect transistors for the input devices. The remaining transistors in the circuit are bipolar transistors, either NPN or PNP. These circuits require complex fabrication processes which are capable of monolithically integrating the different types of transistors in the same circuit. When operated from a single positive supply voltage, such amplifiers exhibit poor operation as the input common mode voltage approaches ground. Also, a typical one of these circuits cannot operate with a negative input common mode voltage.

In using the techniques described in greater detail hereinafter, it is possible to design a complete operational amplifier using only MOSFETs. No other type of components is needed in one such configuration. Another advantage of a MOSFET operational amplifier over existing operational amplifiers is the extremely large input impedance which is characteristic of the gate to source impedance of MOSFETs. Since the MOSFET is a voltage driven device as contrasted to bipolar transistors which are current driven devices, extremely low offset and bias currents can be realized using MOSFETs for input transistors. A MOSFET operational amplifier exhibits a leakage current lying in the range of pico amps rather than in the range of nano amps as found in bipolar amplifiers.

With proper control of the threshold voltages of both the P and N-channel transistors, a CMOS operational amplifier operates with an extremely large input common mode voltage swing. When such an amplifier operates from a single positive supply voltage, it can operate with negative input common mode voltage signals. Such an operating mode cannot be easily obtained from bipolar amplifiers since $V_{BE}$ of both the NPN and PNP transistors is virtually equal.

Another advantage of a CMOS operational amplifier is that true complementary symmetry can be obtained with a CMOS integrated circuit, while true complementary symmetry cannot be obtained when using bipolar transistors. It is common knowledge that good PNP transistors cannnot be made in the same process as good NPN transistors. However, a good P-channel device can be made in the same process as a good N-channel device. Although a MOSFET device is considerably smaller than a bipolar transistor, comfortable gains are obtainable from these CMOS operational amplifier without affecting the frequency response of the system due to the low capacitance of the MOSFET.

The CMOS operational amplifiers which are described in this invention utilize MOSFETs for active loads. This characteristic offers the following advantages:

a. It makes it possible to design an operational amplifier with MOSFETs being the only components used.

b. It provides large load impedances and, hence, large voltage gain with relatively small chip area by increasing gate width(s) and operating the load devices in the saturation region.

c. Utilizing the MOS process technology, active devices can be fabricated to have a better match than passive components such as resistors. Therefore, using MOSFETs for active loads improves the input offset voltage characteristics of the differential amplifier. Since large load impedances are realized in small chip areas, low parasitic capacitances are associated with these loads which increases the amplifier's slewing rate.

d. Input common-mode voltage swing can be improved by controlling the threshold voltages of the load devices.

A relatively high initial input offset voltage is characteristic of a CMOS operational amplifier as compared to a low input offset voltage as being characteristic of a bipolar operational amplifier. Statistical data obtained on recently integrated CMOS operational amplifiers have shown that input offset voltage drift with temperature is as good as those obtained from some bipolar transistors.

An additional advantage of a CMOS amplifier over a bipolar amplifier is the fact that CMOS amplifiers can be biased at extremely low drain currents without appreciably affecting the voltage gain of the amplifier.

Various designs of CMOS operational amplifiers are described hereinafter that can be operated from either a single positive supply voltage or a single negative power supply voltage. It is possible to design a monolithically integrable CMOS operational amplifier that can offer an extremely low power drain level and/or an extremely wide range of supply voltages.

SUMMARY OF THE INVENTION

This invention relates to a family of operational amplifiers, and more particularly it relates to a family of operational amplifier circuits using only silicon gate or metal gate MOSFET transistors as the active devices.

It is an object of the present invention to provide a family of operational amplifier circuits having a virtually infinite input impedance and zero input offset and bias currents.

It is another object of this invention to provide a family of operational amplifier configurations which are capable of operating within a wide range of DC supply voltages at extremely low DC current flow.

Another object of the present invention is to provide a family of operational amplifier curcuits in which all of the components are manufacturable through complementary MOSFET monolithic integration processes.

A still further object of the present invention is to provide a family of operational amplifier circuits which are capable of operating from a single positive DC supply voltage while maintaining excellent operation over a wide range of input common node voltage swings, including operation with negative input common node voltages.

It is another object of the present invention to provide a family of operational amplifiers which can be supplied from a combination of a single positive DC voltage with a single negative DC voltage with operation over a wide positive and negative input common mode voltage swing.

A further object of the present invention is to provide an operational amplifier which is capable of operating from a single negative DC supply voltage which operates over a range of positive input common mode voltage swings.

Another object of the present invention is to provide a family of operational amplifiers which operate with a combination of a single positive and a single negative supply voltage, and which operate over a wide range of positive and negative input common mode voltage swings.

It is an object of this invention to utilize MOSFETs having a large impedance between its drain and source terminals and having a drain to source current independent of drain to source voltage as the constant current source in all operational amplifier configurations.

These and other objects and features of this invention will become fully apparent in the following description of the accompanying drawings herein:

DESCRIPTION OF THE DRAWINGS

FIG. 1a is a circuit diagram designation of a P-channel MOSFET;

FIG. 1b is a circuit diagram designation of an N-channel MOSFET;

FIG. 2 shows a typical current-voltage relationship of N- and P-channel MOSFETs;

DETAILED DESCRIPTION OF THE INVENTION

Figure 3A:
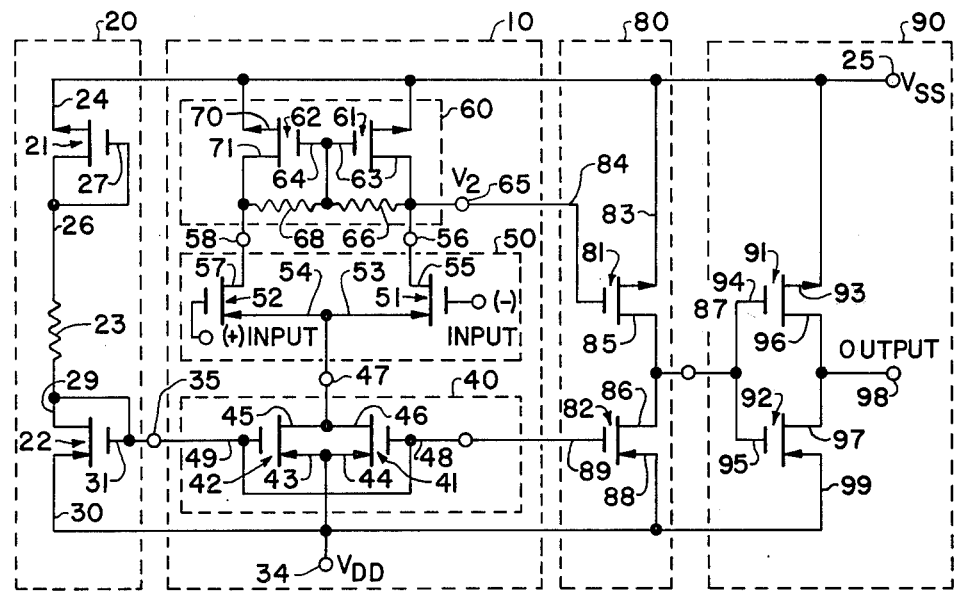
FIG. 3a is a circuit schematic showing a first embodiment of an operational amplifier having a balanced differential amplifier stage.

Throughout the several Figures, the same numeral is used to identify the same component.

Referring to FIG. 1a, there is shown a P-channel MOS field effect transistor. The P-channel device operates in substantially the same way as the N-channel device. This transistor conducts current between its source and drain, when the following two conditions are satisfied: First, the drain is at a negative potential with respect to the source; and second, the gate is at a negative potential with respect to the source and this gate to source potential should exceed in magnitude a certain voltage called a threshold voltage of this device.

Referring to FIG. 1b, there is shown an N-channel MOS field effect transistor. The transistor conducts current between its drain and source, when the following two conditions are satisfied: First, the drain is at a positive potential with respect to the source; and second, the gate to source potential is positive and the gate to substrate voltage exceeds a certain voltage called a threshold voltage of that N-channel device.

The family of operational amplifiers described hereinafter comprise (a) a bias network, (b) a differential amplifier stage, (c) an intermediate stage, and (d) an output stage.

An ideal constant current source provides a current which is independent of the voltage drop across its terminals.

Reference is made to the typical MOSFET I-V relationships shown in FIG. 2. It is clear that in the saturation region, the drain-source terminals of a MOSFET provide near ideal current source. This is due to the fact that the drain to source current remains virtually constant as the drain to source voltage is varied. The magnitude of the current can be controlled, however, by adjusting the gate to source voltage. In the amplifier configurations embodied in this invention, the drain to source terminals of a MOSFET are utilized for a constant current source whose magnitude is adjusted by varying the gate to source voltage.

In order to guarantee a MOSFET operation in the saturation region, the drain to source voltage should exceed a minimum value which is equal to the saturation voltage ($V_{DSAT}$) which is approximately equal to $V_{GS}-V_T$ where $V_{GS}$ is the gate-to-source voltage and $V_T$ is the threshold voltage which is controlled by such process parameters as impurity concentration, oxide thickness, flat band voltage, and surface trap density at the interface between gate oxide and the silicon in the channel region, etc.

For an ideal current operation $V_{DSAT}$ must be minimized to allow operation at low drain to source voltages. Also, to allow ideal current source operation at large drain to source voltages, the drain to source breakdown voltage must be maximized.

In this context, the DC bias network is that which provides the proper DC currents and voltages to the rest of the differential amplifier specifically the current source.

The bias network should: 1) insure that all MOSFETs in the operational amplifier, including current source, input, and load MOSFETs, operate in the proper mode of operation (all MOSFETs must operate in the saturdation region); 2) allow for adjustment of total DC current drain; 3) allow proper operation over a wide range of temperature; 4) allow proper operation with process variations; 5) allow for a wide range of input common mode voltage swing; 6) allow proper operation over a wide range of DC supply voltages; and 7) provide a means of input voltage offset adjustment.

A suitable input differential stage should provide: 1) an infinite input impedance, 2) a zero input bias and offset currents, 3) a zero input offset voltage, 4) a relatively large voltage gain; i.e., greater than 20 lb., 5) a low input noise characteristic, 6) a high slew rate, and 7) a large input common mode voltage.

The characteristic of MOSFETs is the large gate to source impedance. Therefore, a MOSFET operating in common source configuration can be utilized effectively as an input transistor in a differential amplifier stage to provide an extremely large input impedance which is deminished only by gate oxide leakage current. Thus, leakage and input currents in the pico-amp region can be achieved. This provides several orders of magnitude reduction in input offset and bias current characteristics as compared to the existing bipolar differential amplifier; i.e., pico-amps rather than at best nano-amps.

Large gains can be obtained by maximizing the gate width to length ratio of the input MOSFETs, higher Z/L results in higher Gm, and by utilizing MOSFETs for active loads to provide the necessary large load impedances. This can be done with small load parasitic capacitance, thus enhancing the slewing rate of the differential amplifier.

Also, by properly controlling the N- and P-channel MOSFET threshold voltages, a wide range of input common mode voltage swings can be obtained. Also, negative input common mode voltage operation can be obtained even when the differential amplifier is supplied from a single positive DC voltage. This is an advantage over bipolar amplifiers since the $V_{BE}$ drop is almost the same for NPN and PNP transistors.

A suitable intermediate stage should have the following characteristics:

1. it must provide the necessary DC voltage level shifting to properly bias the load;
2. it should provide some voltage gain;
3. it should have fast slewing rate.

A suitable output stage should have the following characteristics:

1. it must be able to allow input signal voltage swing between V and VT;
2. it must be capable of driving a specified load;
3. it must have fast switching characteristics.

Referring to FIG. 3, there can be seen a schematic view of a first operational amplifier made according to the taching of the present invention. Each of the operational amplifiers utilizes at least a first differential amplifier 10, and each of these differential amplifiers includes a biasing means such as a biasing network 20 as shown in FIG. 3. A typical differential amplifier also includes a constant current source 40, an input stage 50, and a load network 60.

The biasing network comprises a plurality of transistors 21 and 22 and a resistor 23. Each transistor includes a source, drain and gate electrode. A source electrode 24 of the transistor 21 is connected to the minus voltage supply 25. A drain electrode 26 of the transistor 21 is connected to a gate electrode 27 of the same transistor 21 as well as to one end of the resistor 23. The other end of the resistor 23 is connected to a drain electrode 29 of the transistor 22. The drain electrode 29 of the transistor 22 is connected to a gate electrode 31 and a biasing terminal 35 which provides the biasing voltage $V_B$ to the remaining section of the differential amplifier. A source electrode 30 of the transistor 22 is connected to the positive supply voltage indicated at a terminal 34. This is a typical biasing network. Several alternative biasing networks are completely described in a copending U.S. pat. application entitled "Differential Amplifier," Ser. No. 505,101, filed Sept. 11, 1974, and now U.S. Pat. No. 3,947,778 which is incorporated by reference herein.

The constant current source 40 comprises a pair of transistors 41 and 42 and each have source, drain and gate electrodes. A source electrode 43 of the transistor 42 is connected to a source electrode 44 of the transistor 41 and the common connection is connected to the positive voltage supply 34. A drain electrode 45 of the transistor 42 is connected to a drain electrode 46 of the transistor 41, and the common connection is connected to a constant current input connection 47 of the input stage 50. A gate electrode 48 of the transistor 41 is connected to a gate electrode 49 of the transistor 42.

The input stage 50 comprises a pair of transistors 51 and 52 and each has a source, drain and gate electrode. A source electrode 53 of the transistor 51 is connected to a source electrode 54 of the transistor 52 and, the common connection is connected to the current input connection 47. A drain electrode 55 of the transistor 51 is connected to a junction 56 and the drain electrode 57 of the transistor 52 is connected to a junction 58.

The load network 60 comprises a pair of transistors 61 and 62 and each has source, drain and gate electrodes. A gate electrode 63 of a transistor 61 is connected to a gate electrode 64 of the transistor 62. The gate electrode 63 is also connected to an output terminal 65 by a resistor 66. The gate electrode 64 of the transistor 62 is connected to the output terminal 65 by the same resistor 66. A source terminal 69 of the transistor 61 is connected to a source terminal 70 of the transistor 62, and the common connection is connected to a source of negative potential indicated at 25. A drain electrode 71 of the transistor 61 is connected to the junction 56, and a drain electrode 72 of the transistor 62 is connected to the junction 58. The drain electrode 71 of the transistor 62 is connected to the junction of the gate electrode connected to one end of the resistor 66 by a second resistor 68.

The operational amplifier also includes an intermediate stage 80 and an output stage 90. The intermediate stage comprises a pair of transistors 81 and 82 and each has source, drain and gate electrodes. A source electrode 83 of the transistor 81 is connected to the negative potential source 25. A gate electrode 84 of the transistor 81 is connected to the output terminal 65 of the differential amplifier. A drain electrode 85 of the transistor 81 is connected to a drain electrode 86 of the transistor 82 and both are connected to an output terminal 87 of the intermediate stage 80. A source terminal 88 of the transistor 82 is connected to the positive level 34 of the power supply. A gate electrode 89 is connected to the gate electrode 48 of the current source transistor 41.

The output stage 90 comprises a pair of transistors 91 and 92. A source electrode 93 of the transistor 91 is connected to the negative level 25 of the power supply. A gate electrode 94 of the transistor 91 is connected to a gate electrode 95 of the transistor 92 and both gate electrodes 94 and 95 are connected to the output terminal 87 of the intermediate stage 80. A drain terminal 96 of the transistor 91 is connected to a drain terminal 97 of the transistor 92, and both drain electrodes 96 and 97 are connected to the output terminal 98. A source electrode 99 of the transistor 92 is connected to the positive level 34 of the power supply.

OPERATION OF THE CIRCUIT

FIG. 3a is a circuit schematic of an operational amplifier which, with the exception of resistors 66 and 68, utilizes only N and P-channel MOS field effect transistors. The values of 66 and 68 can be within the range from less than a hundred kilohms to greater than 1,000 megohms without appreciably affecting the performance of the amplifier. The amplifier can be operated from one single positive DC supply voltage or from two DC power voltages, one positive and one negative. Unless shown otherwise, all substrates of P and N-channel MOSFETs are connected to the most positive and most negative nodes in the circuit, respectively.

In reference to FIG. 3a, the MOSFETs consisting of transistors 21 and 22 form the DC biasing section 20. Transistors 41 and 42 form a constant current source 40. Transistors 51 and 52 form the input stage 50. Transistors 61 and 62 in combination with the resistors 66 and 68 are the loads for transistors 51 and 52, respectively. The transistors 81 and 82 comprise the intermediate stage 80 and the transistors 91 and 92 are the output stage 90. In order to insure proper operation of this operational amplifier, several sets of MOSFET transistors must be reasonably well matched. The first set comprises transistors 22, 41 and 42. The second set comprises transistors 51 and 52. The third set comprises transistors 21, 61 and 62. The gates of transistors 21 and 22 are connected to their respective drains. This guarantees the operation of these transistors in the saturation region, provided that their gate to source voltages exceed the respective threshold voltages. Transistors 21 and 22 and resistor 23 operate together as a voltage divider which provides the gate voltages to the transistors 41 and 42 which are connected in parallel. When operated in the saturation region, transistors 41 and 42 act as a constant current source. Each of the transistors 41 and 42 draws a current equal to that drawn by the transistor 22.

The gates, sources and substrates of transistors 61 and 62 are connected together, respectively. Therefore, if a voltage at terminal $V_1$ is set equal to the voltage at terminal $V_4$, then transistors 52, 51 and 62 and 61 draw equal amounts of current thus forcing the voltage at terminals $V_2$ and $V_5$ to be equal.

To insure proper operation of the CMOS differential amplifier, transistors 41 and 42 must operate in the saturation region to provide a high current source with a constant current even with variations in the voltage at $V_3$ due to variations in voltage $V_1$ and $V_4$. Transistors 51 and 52 operate in the saturation region for maintaining linear amplifier performance.

Under ideal conditions, if the voltage at the two input terminals $V_1$ and $V_4$ are set equal, then transistors 51 and 52 and 61 and 62 draw equal amounts of current and the voltage at terminals $V_2$ and $V_5$ is equal. If a positive differential voltage is applied between terminals $V_1$ and $V_4$, that is if the voltage at terminal $V_1$ is at a higher positive potential than the voltage at terminal $V_4$, then transistor 52 draws less current than transistor 51. Since resistors 66 and 68 draw a minimum current due to their extremely large values, then the transistor 62 still draws an equal amount of current as transistor 52 and transistor 61 draws an equal amount of current as transistor 51. The gate to source voltages of transistors 61 and 62 are equal since the two gates and the two sources of these transistors are tied, respectively. In order for transistor 62 to conduct less current, and become consistent with the current drawn in the transistor 52, the drain to source voltage across the transistor 62 is reduced in order for that device to sustain a lower current flow. The opposite happens to transistor 61, in which case the drain to source voltage of transistor 61 is increased so that the transistor 61 draws an equal amount of current to that drawn by the transistor 51. As the voltage at terminal $V_1$ goes positive with respect to the voltage at Terminal $V_4$, the voltage at terminal $V_4$ approaches the negative voltage and the voltage at terminal $V_5$ approaches the positive voltage. Therefore, there is a phase inversion between the voltages at terminals $V_1$ and $V_2$ and the voltage at terminals $V_1$ and $V_5$ are in phase. By symmetry, the voltages at terminals $V_4$ and $V_2$ are in phase but the voltages at terminals $V_4$ and $V_5$ are out of phase.

Since P-channel MOSFETs 51 and 52 form the two input stages for this amplifier, an extramely large input impedance is expected since the gate to source impedance of the MOSFET is extremely large. With the exception of some gate to source leakage current, the zero input bias and offset currents are characteristic of this circuit. Since MOSFETs exhibit extremely large impedances between their drain and source terminals when operated in the saturation region, the active loads consisting of transistors 61 and 62 provide an extremely large load impedance to transistors 51 and 52, repsectively, thus guaranteeing a large voltage gain. The values of the resistors 66 and 68 are made large enough so that they do not effect the gain of the amplifier appreciably. Their values could be anywhere in the range of less than 100 kilohms to several thousand megohms.

Two MOSFETs, 41 and 42, are used for the constant current source 40 in this amplifier. Under ideal conditions, all transistors in this circuit are operating at the same current level when the two input voltages at terminals $V_1$ and $V_4$ are equal. Since transistors 23, 22 and 21 are operating in the saturation region, then for a large range of input common mode voltage, transistors 52 and 51 and 42 and 41 also operate in the saturation region.

Figure 3B:
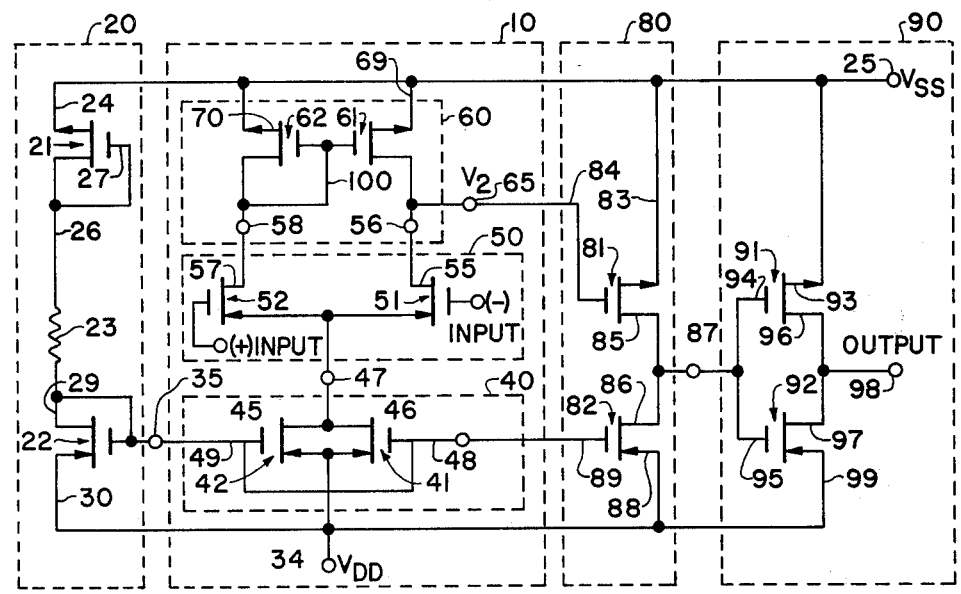
FIG. 3b is a circuit schematic showing a second embodiment of an operational amplifier having an unbalanced differential amplifier stage.

The circuits shown in FIGS. 3a–b provide a self-biased differential amplifier. No bias adjustment is necessary, other than an offset adjustment. Since transistors 22 and 21 continue to operate in the saturation region regardless of the supply voltage magnitude, this circuit, with the exception of the current drain, properly operates independent of the supply voltage variation. The only limitation here is that the supply voltages are large enough to turn the devices on and that they should be small enough so that the devices will not break down. This amplifier configuration provides a balanced output configuration. This feature makes it possible to use the output voltages at $V_2$ and $V_5$ as the input voltages to subsequent differential amplifier stages. The connection of cascaded differential amplifier stages may arise in the design of the high gain operational amplifier with extremely large common-mode rejection ratio or high gain comparator.

It is to be noted that all substrates of all P-channel devices are connected to the most positive supply voltage, and substrates of all N-channel MOSFETs are tied to the most negative supply voltage. It is also to be noted that the amplifier shown in FIGS. 3a–b can operate from a negative input common mode voltage. If the magnitude of the threshold voltage of transistors 52 and 51 exceeds the value of the voltage at $V_2$, then a negative input common mode voltage can be allowed. This feature for the magnitude of the negative input common mode voltage is enhanced by the fact that the substrate of the transistors 52 and 51 are tied to the most positive terminal which is B+, thus providing a back gate bias for the transistors 52 and 51. This increases the threshold voltage to these two transistors.

The intermediate stage 80 comprising transistors 81 and 82 operates as a common source amplifier with MOSFET 81 being the amplifying transistor while MOSFET 82 acts as a load. Transistor 82 has a fixed gate-to-source voltage guaranteeing its operation in the saturation region. Therefore, transistor 82 acts as a current source for transistor 81 and since it has a large impedance between its drain and source terminals, it results in large voltage gain between modes 84 and 87.

The output stage 90 consists of MOSFETs 91 and 92 which are connected electrically as a CMOS inverter. This stage allows an output signal swing from V+ to V−, is capable of fast switching characteristics, and provides additional voltage gain.

Referring to FIG. 3b, there is shown a schematic view of a second operational amplifier. This current is essentially the same as shown in FIG. 3a except for the removal of the resistors 68 and 66. The resistor 68 is replaced with a straight line connection at 100. This causes the differential amplifier 10 in FIG. 3b to be an unbalanced differential amplifier with higher gain.

Figure 4A:
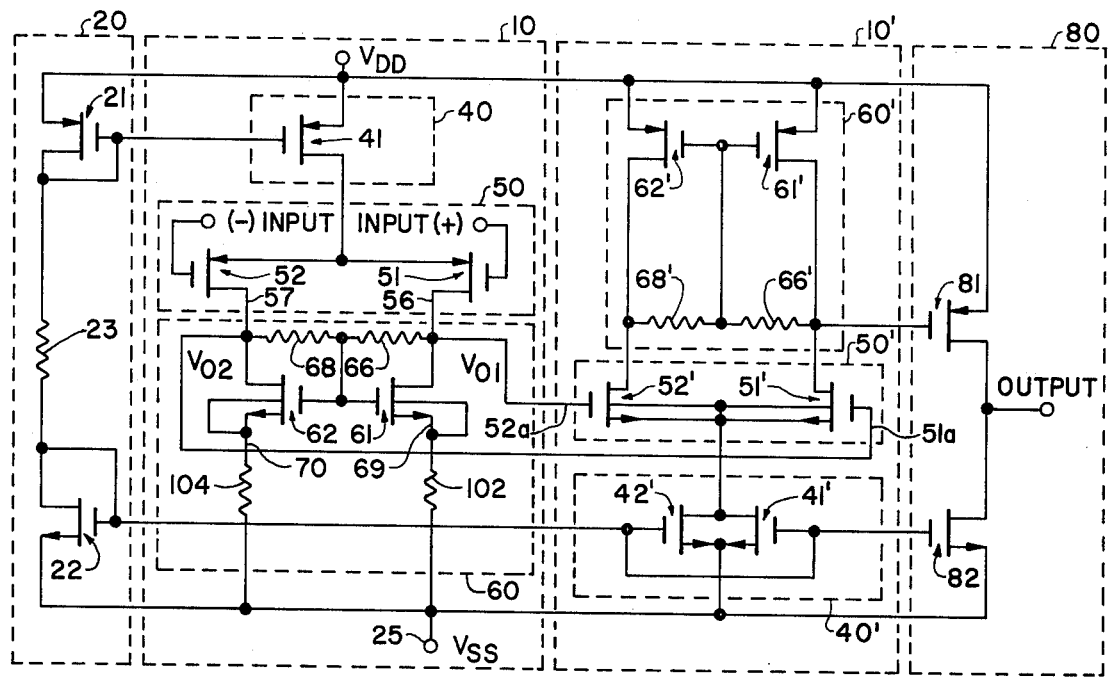
FIGS. 4b-4c are circuit schematics showing further embodiment of an operational amplifier with two balanced differential amplifier stages.

Referring to FIG. 4a, there is shown a schematic view of a further embodiment of an operational amplifier. As the detailed connection of a differential amplifier has been given hereinbefore, it is felt that it need not be repeated for each additional circuit. Therefore, the various stages and individual transistors will be identified only.

The operational amplifier shown in FIG. 4a comprises a bias network 20 comprising transistors 21 and 22 and resistor 23 as previously described. A first differential amplifier is at 10 and a second differential amplifier is at 10. The output stage is at 80. Additional output stages such as 90 shown in FIGS. 3a and 3b can be added if desired.

The first differential amplifier has at current source at 40 comprising a single transistor 41. An input stage 50 comprises a pair of transistors 51 and 52. The load circuit 60 comprises transistors 61 and 62, resistors 68 and 66 plus additional resistors 102 and 104 placed in series between source electrodes 69 and 70 of transistors 61 and 62 and the negative level 25 of the power supply.

The output of the first differential amplifier 10 is the input to the second differential amplifier. This output is available as the drain electrodes 55 and 57 of the transistors 51 and 52, respectively.

The second differential amplifier 10' is identified by raising similar elements to the prime. A current source is at 40', with the input stage at 50' and the load stage at 60'.

The drain electrode 57 of transistor 52 in the first differential amplifier is the input to the gate electrode 51a of the transistor 51' in the input stage 50' of the second differential amplifier 10'. The drain electrode 55 of transistor 51 in the first differential amplifier is the input to the gate electrode 52a of the transistor 51' in the input stage 50' of the second differential amplifier 10'.

Resistors 102 and 104 in the first differential stage 10 act as level shifting elements providing the proper bias to the second differential stage 10'. These resistors insure that the devoltage level at the output from the first differential stage is capable of driving both the input stage 50' and the current source 40'.

Figure 4B:
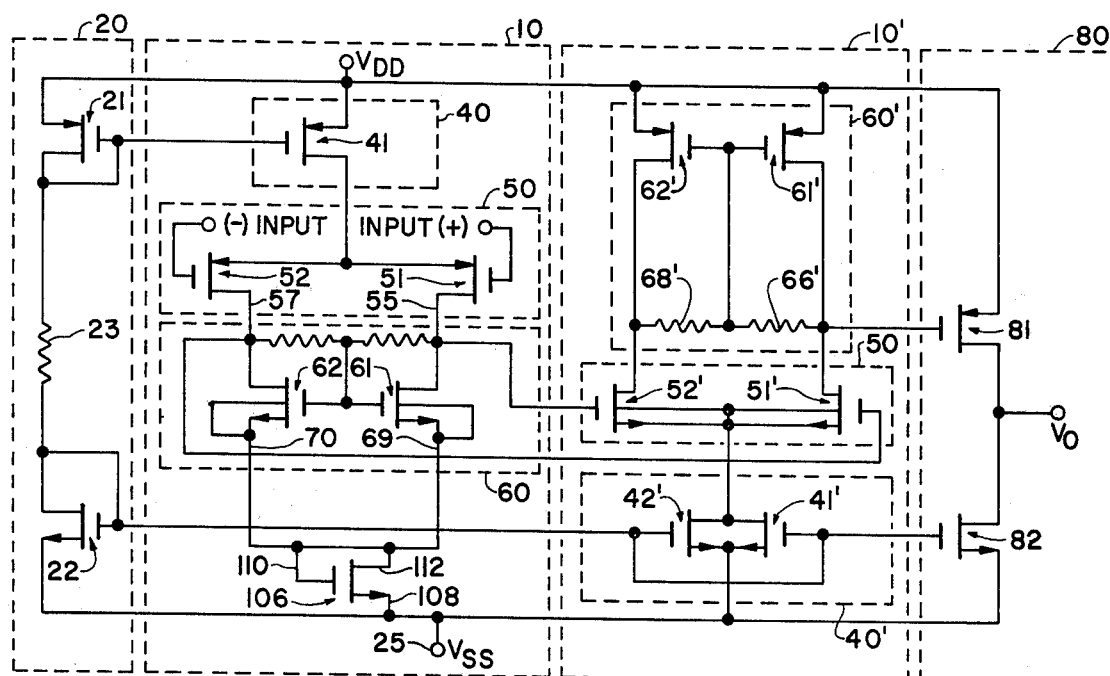

Referring to FIG. 4b, there can be seen an operational amplifier substantially identical to that shown in FIG. 4a except for a different way for biasing the output of the first differential amplifier 10 in order to provide sufficient driving voltage to drive the second differential stage 10'. In this view, an additional transistor 106 is placed intermediate the load stage 60 and the negative voltage level 25. The transistor 106 has source, drain and gate electrodes. A source electrode 108 is connected to the negative voltage level 25. A gate electrode 110 is connected to a drain electrode and both are connected to the source electrodes 69 and 70 of the load transistors 61 and 62, respectively.

The additional transistor 106 insures that the output devoltage available on the drains 55 and 57 of the input transistors 51 and 52, respectively, can bias the input stage 50' of the second differential amplifier and guaranteeing the MOSFETs 41' and 42' operate in the saturation region.

Figure 4C:
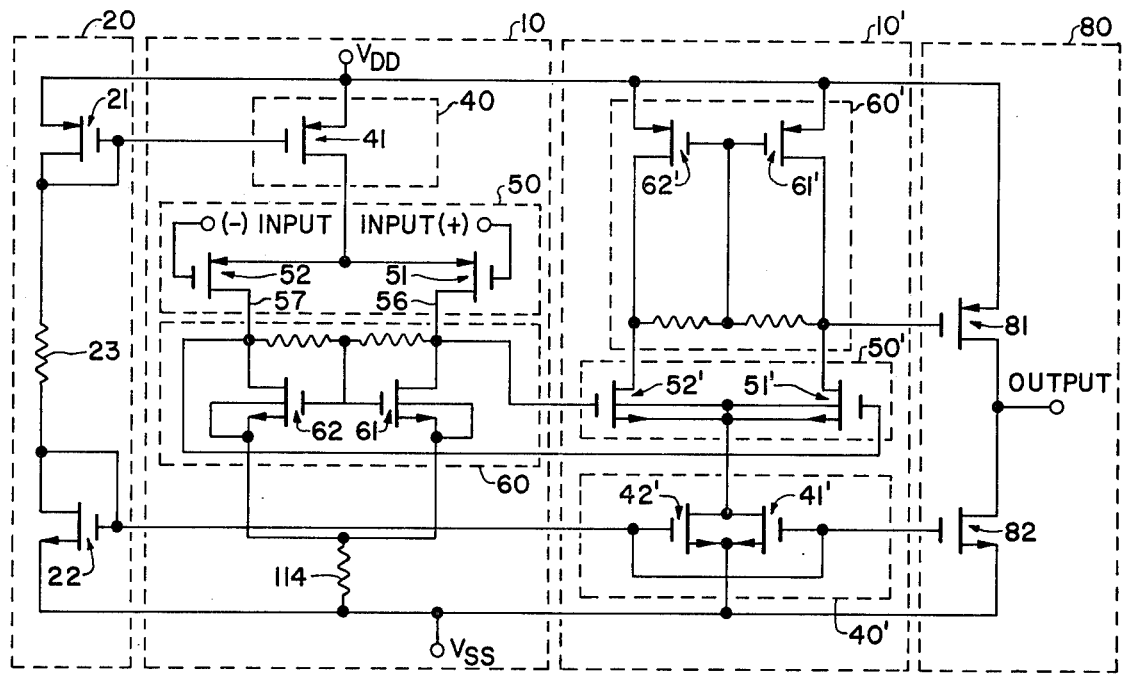

Referring to FIG. 4c, there can be seen an operational amplifier substantially identical to that shown in FIGS. 4a and 4b except for a different way for biasing the output of the first differential amplifier 10 in order to provide sufficient driving voltage to drive the second differential stage 10'. In this view, an additional resistor 114 is placed intermediate the source electrodes 69 and 70 of the load transistors 61 and 62 and the negative voltage level 25 of the power supply.

The sources and substrates of each of MOSFETs 61, 62, 51 and 52 are connected as shown in FIGS. 4a–c in order to insure maximum input common-mode voltage swing.

Figure 5A:
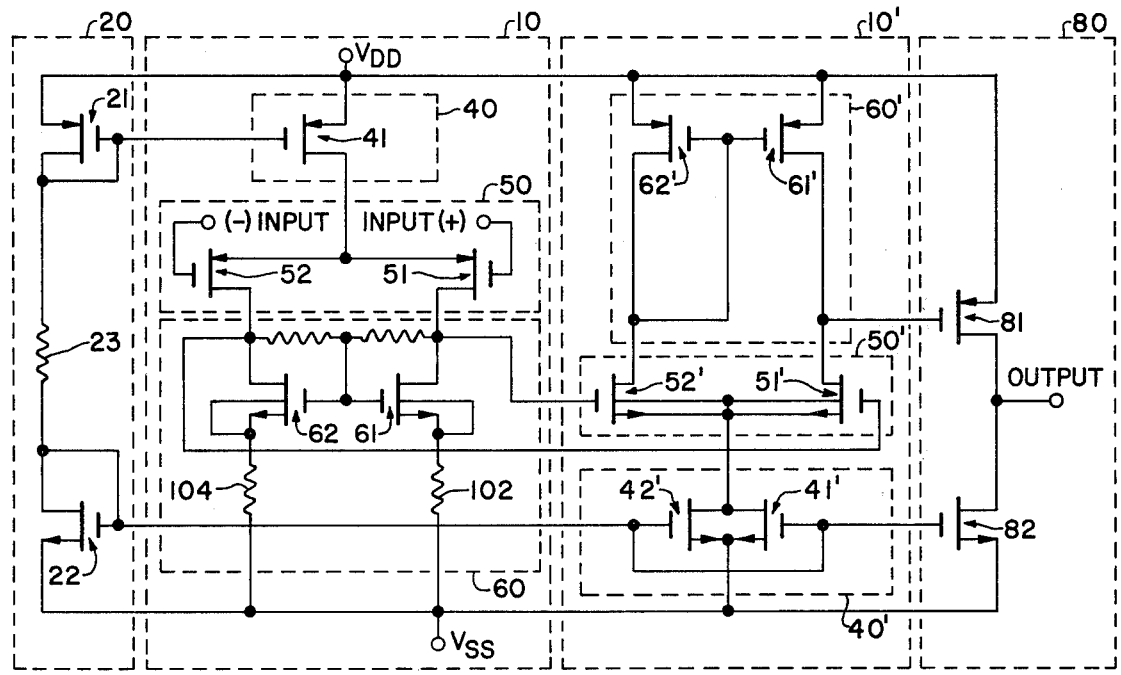
FIGS. 5a-5c are circuit schematics showing further embodiment of an operational amplifier with a first balanced differential stage and a second unbalanced differential stage.
Figure 5B:
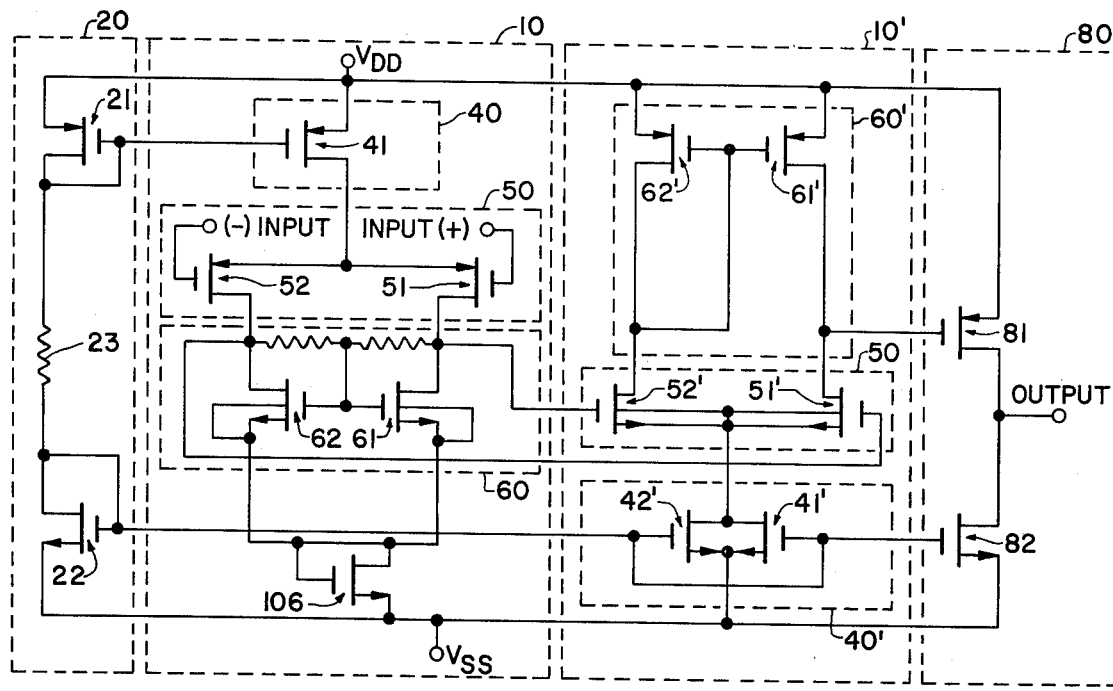
Figure 5C:
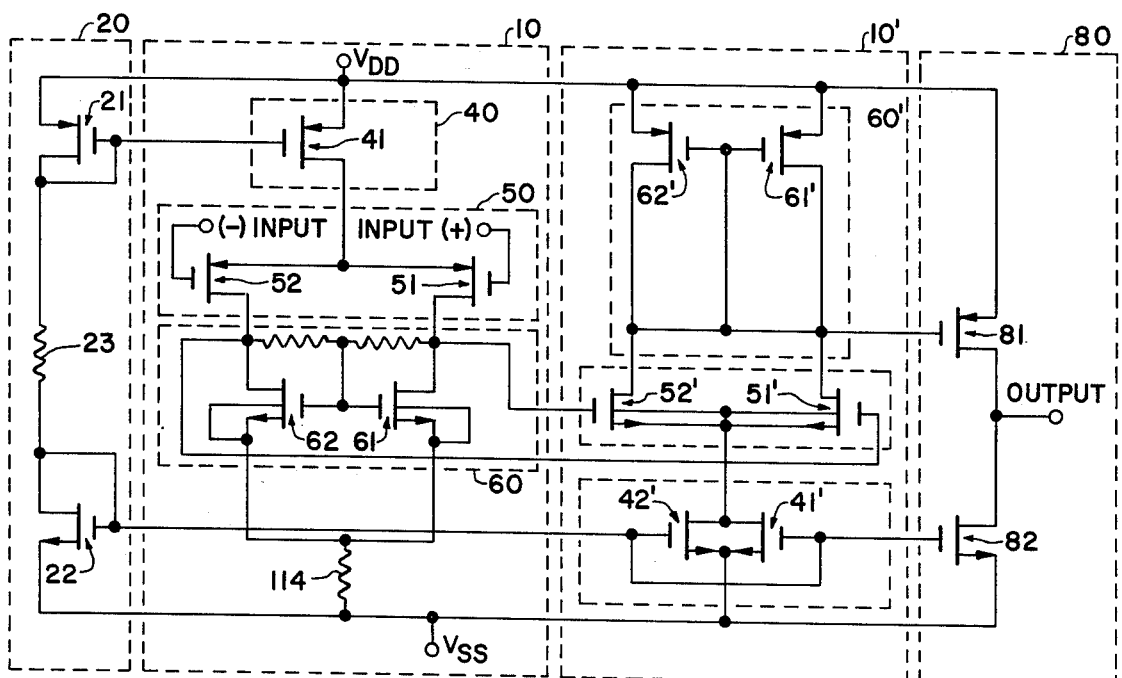

Referring briefly to FIGS. 5a, 5b and 5c, there can be seen schematic views of three operational amplifiers which correspond to the same schematics as shown in FIGS. 4a, 4b and 4c except that the amplifiers in FIGS. 5a, 5b and 5c have a balanced first differential stage 10 and an unbalanced second stage 10'. This gives added gain for the overall circuit.

While there has been shown and described and pointed out the fundamental novel features of the invention as applied to the preferred and other embodiments, it will be understood that various omissions and substitutions and changes in the form and details of the structural element may be made by those skilled in the art without departing from the spirit of the invention.

What is claimed is:

1. An operational amplifier comprising:
   A. a source of potential having at least a first and a second voltage level;
   B. a first and a second differential amplifier, each of said differential amplifiers including:
   C. differential input means for receiving two input signals to be compared, each of said differential input means comprising:
      1. a first MOSFET input device having source, drain and gate electrodes;
      2. a second MOSFET input device having source, drain and gate electrodes;
      3. said source electrodes of said first and said second input devices being connected together and being coupled to a MOSFET constant source means;
      4. said gate electrode of said first input device being adapted to receive a first input signal to be compared; said gate electrode of said second input device being adapted to receive a second input signal to be compared;
   D. load means comprising active load devices coupled to said differential input means and coupled to one or more output terminals for producing an output signal responsive to said differential input means, said output terminal having a quiescent operating point and said load means comprises:
      1. a first MOSFET load device having source, drain and gate electrodes;
      2. a second MOSFET load device having source, drain and gate electrodes;
      3. said source electrode of said first load device being connected to said source electrode of said second load device and to said first voltage level;
      4. said drain electrode of said first load device being connected to said drain electrode of said first input device for forming a first output terminal;
      5. said drain electrode of said second load device being connected to said drain electrode of said second input device for forming a second output terminal;
      6. said gate electrode and said drain electrode of said first load device and said gate electrode and said drain electrode of said second load device each being coupled to a load bias means;
      7. said second output terminal being coupled to said output means for providing an amplified output signal;
   E. wherein said load bias means coupled to said output terminals and to said active load for generating a compensating response for stabilizing said quiescent operating point comprises;

1. a first resistor connected between said gate electrode of said first load device and said drain electrode of said same device;
2. a second resistor connected between said gate electrode of said second load device and said drain electrode of said same device; and
3. a conductor connecting said gate electrode of said first load device and said gate electrode of said second load device;

F. wherein said MOSFET devices of said differential input means of said first differential amplifier are of a first conductivity type;

G. said MOSFET active load devices of said load means of said first differential amplifer are of a second conductivity type opposite to said first conductivity type;

H. said MOSFET devices of said differential input means of said second differential amplifier are of said second conductivity type; and I. said MOSFET active load devices of said load means of said second differential amplifier are of said first conductivity type; and said operational amplifier further includes:

J. a MOSFET biasing network connected between said first and said second voltage level for providing a first reference voltage and a second reference voltage;

K. a first MOSFET constant current source means coupled to said differential input means of said first differential amplifier, responsive to said first reference voltage for providing a first constant current; and L. a second MOSFET constant current source means coupled to said differential input means of said second differential amplifier, responsive to said second reference voltage for providing a second constant current.

2. An operational amplifier as recited in claim 1 wherein said MOSFET devices of the first conductivity type are P-channel MOSFETs and wherein said MOSFET active load devices of a second conductivity type are N-channel MOSFETs.

3. An operational amplifier comprising:
A. a source of potential having at least a first and a second voltage level;
B. a first and a second differential amplifier, each of said differential amplifiers including:
C. differential input means for receiving two input signals to be compared, each of said differential input means comprising:
1. a first MOSFET input device having source, drain and gate electrodes;
2. a second MOSFET input device having source, drain and gate electrodes:
3. said source electrodes of said first and said second input devices being connected together and being coupled to a MOSFET constant current source means;
4. said gate electrode of said first input device being adapted to receive a first input signal to be compared; said gate electrode of said second input device being adapted to receive a second input signal to be compared;
D. load means comprising active load devices coupled to said differential input means and coupled to one or more terminals for producing an output signal responsive to said differential input means, said output terminal having a quiescent operating point and said load means comprises:
1. a first MOSFET load device having source, drain and gate electrodes;
2. a second MOSFET load device having source, drain and gate electrodes;
3. said source electrode of said first load device being connected to said source electrode of said second load device and to said first voltage level;
4. said drain electrode of said first load device being connected to said drain electrode of said first input device for forming a first output terminal;
5. said drain electrode of said second load device being connected to said drain electrode of said second input device for forming a second output terminal;
6. said gate electrode and said drain electrode of said first load device and said gate electrode and said drain electrode of said second load device each being coupled to a load bias means;
7. said second output terminal being coupled to said output means for providing an amplified output signal;

E. wherein said load bias means coupled to said output terminals and to said active load for generating a compensating response for stabilizing said quiescent operating point comprises:
1. a conductor interconnecting said drain electrode of said first load device, said gate electrode of said same device and said gate electrode of said second load device;
2. a resistor connected between said gate electrode of said second load device and said drain electrode of said same device; and
3. a conductor connecting said gate electrode of said first load device and said gate electrode of said second load device;

F. wherein said MOSFET devices of said differential input means of said first differential amplifier are of a first conductivity type;

G. said MOSFET active load devices of said load means of said first differential amplifier are of a second conductivity type opposite to said first conductivity type;

H. said MOSFET devices of said differential input means of said second differential amplifier are of said second conductivity type; and I. said MOSFET active load devices of said load means of said second differential amplifier are of said first conductivity type; and said operational amplifier further includes:

J. a MOSFET biasing network connected between said first and said second voltage level for providing a first reference voltage and a second reference voltage;

K. a first MOSFET constant current source means coupled to said differential input means of said first differential amplifier, responsive to said first reference voltage for providing a first constant current, and L. a second MOSFET constant current source means coupled to said differential input means of said second differential amplifier, responsive to said second reference voltage for providing a second constant current.

4. An operational amplifier as recited in claim 3 wherein said MOSFET devices of a first conductivity type are P-channel MOSFETs and wherein said MOSFET active load devices of a second conductivity type are N-channel MOSFETs.

* * * * *